United States Patent [19]
Arneson

[11] 4,298,849
[45] Nov. 3, 1981

[54] DUALL-PASSBAND SURFACE ACOUSTIC WAVE FILTER

[75] Inventor: Steven H. Arneson, Mesa, Ariz.

[73] Assignee: Motorola, Inc., Schaumburg, Ill.

[21] Appl. No.: 85,081

[22] Filed: Oct. 15, 1979

[51] Int. Cl.³ .................. H03H 9/64; H03H 9/70; H03H 9/76

[52] U.S. Cl. .................. 333/193; 333/195; 333/196

[58] Field of Search .................. 333/193–196, 333/150–155; 331/107 A; 310/313, 313 R, 313 B, 313 C, 313 D; 330/5.5; 364/821; 332/26; 455/124, 188, 189, 191, 290, 307; 358/167, 188, 904, 905

[56] References Cited

U.S. PATENT DOCUMENTS

| | | | |
|---|---|---|---|
| 3,582,838 | 6/1971 | DeVries | 333/194 |
| 3,582,840 | 6/1971 | DeVries | 333/193 |
| 3,600,710 | 8/1971 | Adler et al. | 333/193 |
| 3,836,876 | 9/1974 | Marshall et al. | 333/195 X |
| 3,859,608 | 1/1975 | Hartmann et al. | 333/195 |
| 3,921,093 | 11/1975 | Lewis | 331/107 A |
| 3,970,970 | 7/1976 | Worley | 333/195 |
| 4,044,321 | 8/1977 | Vasile | 310/313 X |
| 4,047,130 | 9/1977 | Lim et al. | 333/194 |
| 4,063,202 | 12/1977 | Vasile | 333/195 X |

FOREIGN PATENT DOCUMENTS

| | | | |
|---|---|---|---|
| 1517371 | 7/1978 | United Kingdom | 333/150 |
| 585589 | 12/1977 | U.S.S.R. | 333/193 |

OTHER PUBLICATIONS

Parker et al.–"A Saw Oscillator Using Two Acoustic Paths", 1976 Ultrasonics Symposium Proceedings, IEEE Cat. No. 76 CH1120-5SU, 1976; pp. 243–247.

Primary Examiner—Marvin L. Nussbaum
Attorney, Agent, or Firm—Rolland R. Hackbart; James W. Gillman

[57] ABSTRACT

A three-transducer SAW filter is disclosed that includes a central input transducer requiring only one-half of the interdigital fingers normally required by prior art three-transducer SAW filters. As a result, two input transducers may now be provided in the space normally occupied by one prior art input transducer. The only requirement is that each input transducer have an axis of symmetry about which surface waves are propogated symmetrically. Since each input transducer may have a different frequency response, a dual-passband SAW filter may now be provided in the space normally occupied by a single prior art SAW filter. Furthermore, a multi-passband SAW filter may be provided by arranging pairs of input transducers between three or more output transducers which are electrically coupled in parallel. In addition, the input and output connections of a multi-passband SAW filter may be interchanged such that an input signal, applied to the parallel connected output transducers is frequency sorted by the passbands of each of the input transducers.

18 Claims, 6 Drawing Figures

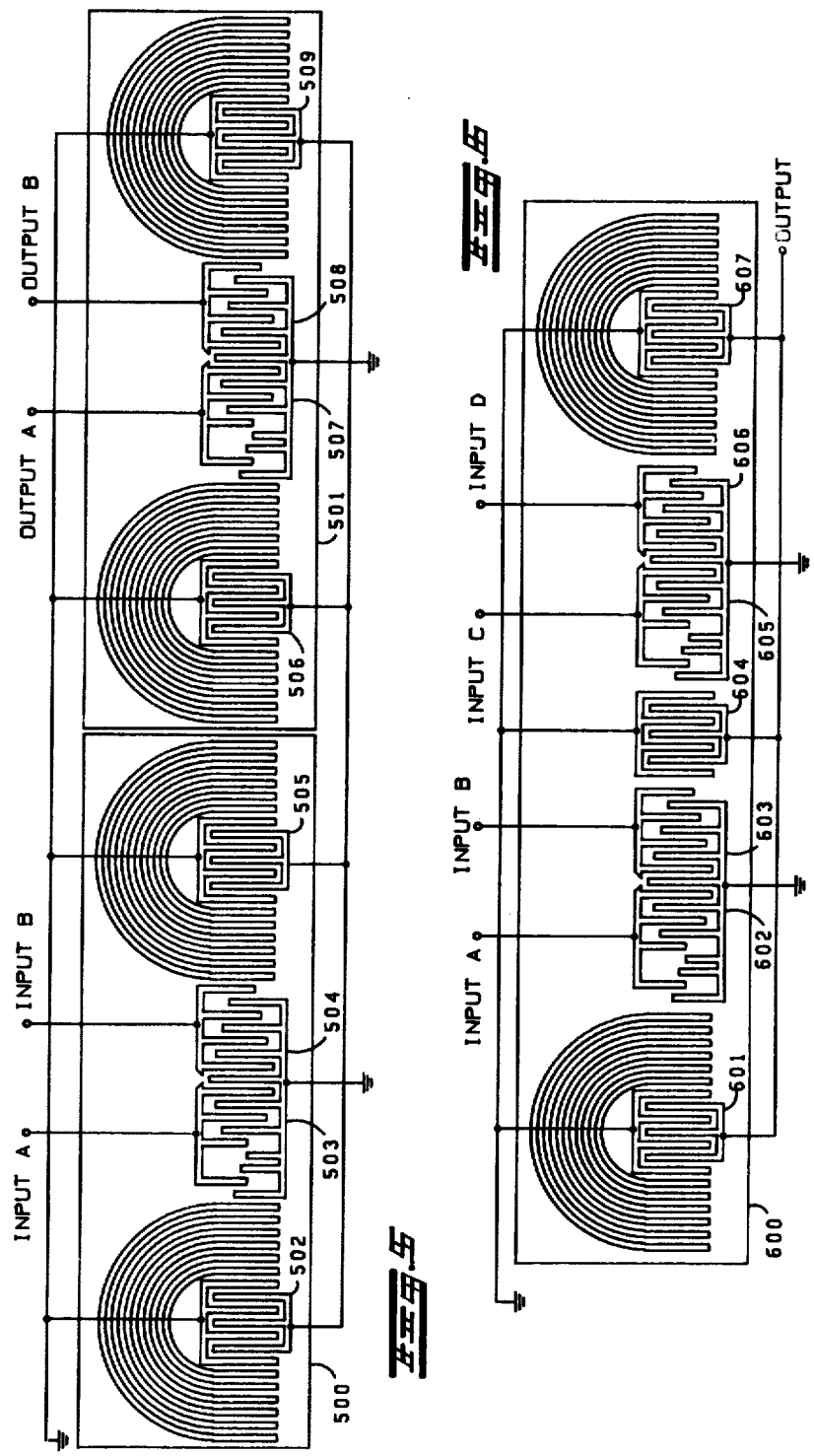

DUAL-PASSBAND SURFACE ACOUSTIC WAVE FILTER

BACKGROUND OF THE INVENTION

The present invention relates to electrical filters for passing a band of frequencies, and more particularly to surface acoustic wave filters, commonly referred to as SAW filters.

A typical SAW filter includes a flat piezoelectric wafer as a substrate on which are disposed an input transducer and an output transducer, each having a plurality of interdigital fingers. The spacing between the interdigital fingers of the transducers defines the wavelength of surface acoustic waves to which the transducer responds. The wavelength thus defined determines a passband center frequency for the respective transducer. When an input signal is coupled to the input transducer, a voltage is applied between adjacent interdigital fingers thereof which deforms the surface thereunder, resulting in an elastic wave that is propagated across the surface of the piezoelectric wafer to the output transducer. At the output transducer, the elastic deformation polarizes the surface of the wafer and sets up a voltage between the interdigital fingers thereof, provided that the interdigital fingers of the output transducer are properly spaced in relation to the polarization pattern induced in the wafer by the input transducer.

The interdigital fingers of the input and output transducers may be implemented with any suitable conventional type of weighting, such as, for example, apodized weighting where the overlap of adjacent interdigital fingers is sinewave contoured for improving the passband characteristics of the filter. The design and characteristics of SAW filters are generally described in the report entitled, "New Analog Surface Wave Filter Techniques and Applications", published by the National Electronics Conference in 1972.

SAW filters may also be arranged in a three-transducer configuration, where an input transducer is surrounded by two output transducers for increasing the overall filter gain. Various types of three-transducer SAW filters are described in U.S. Pat. Nos. 3,582,838, 3,582,840, 3,970,970, 4,044,321, 4,047,130 and 4,063,202. These prior art three-transducer SAW filters provide somewhat improved electrical characteristics over two-transducer SAW filters, but require larger wafers and more interdigital fingers due to the additional transducer. However, as the number of interdigital fingers increases, both filter distortion due to the mass loading and electrical discontinuities of each finger, and fabrication costs increase proportionally. Furthermore, it is often desirable to provide multiple passbands in a single SAW filter. In order to provide multiple-passband characteristics with prior art SAW filters, it has been necessary to utilize two or more of the foregoing two-transducer or three-transducer SAW filters and a summing circuit for combining the respective filter output signals to provide a composite output signal.

SUMMARY OF THE INVENTION

Accordingly, it is an object of the present invention to provide an improved three-transducer SAW filter wherein the number of interdigital fingers required for the central transducer may be substantially reduced.

It is another object of the present invention to provide an improved three-transducer SAW filter, which exhibits improved distortion characteristics over prior art three-transducer SAW filters.

It is another object of the present invention to provide an improved three-transducer SAW filter having a dual passband for predeterminedly filtering two input signals and providing a composite output signal.

It is a further object of the present invention to provide an improved dual-passband SAW filter that is compact in size and relatively inexpensive to fabricate.

Briefly described, the invention is a SAW filter that includes a piezoelectric substrate, first and second transducers disposed on the surface of the substrate at a predetermined distance from one another and a third transducer disposed on the surface of the substrate between the first and second transducers. The third transducer has an axis of symmetry located substantially equidistant between the first and second transducers. The third transducer further includes a plurality of parallel interdigital fingers, which are disposed substantially to one side of the axis of symmetry. Thus, interdigital fingers are not required on the side opposite to said one side of the axis of symmetry of the third transducer, resulting in a savings of one-half of the number of interdigital fingers required in prior art SAW filters. The first and second transducers also include a plurality of parallel interdigital fingers and may be further electrically coupled in parallel. Surface acoustic waves produced by an input signal that is applied to the third transducer are received by the first and second transducers and combined to provide a composite output signal.

Another embodiment of the present invention further includes a fourth transducer which also has an axis of symmetry collinear with the axis of symmetry of the third transducer. The fourth transducer also has a plurality of parallel interdigital fingers. The third and fourth transducers may be arranged such that the interdigital fingers of the third transducer are disposed to one side of the axis of symmetry, and the interdigital fingers of the fourth transducer are disposed to the side opposite said one side of the axis of symmetry. As a result, the third and fourth transducers are provided in the same space that would normally be occupied by one prior art transducer. Thus, when first and second input signals are coupled to the third and fourth transducers, respectively, the first and second transducers provide a composite output signal comprised of the filtered and combined first and second input signals. Furthermore, the dual-passband SAW filter may be arranged inversely, such that an input signal coupled to the first and second transducers is essentially sorted in frequency by the third and fourth transducers to provide corresponding output signals.

BRIEF DESCRIPTION OF THE DRAWINGS

FIG. 5 shows two identical dual-passband SAW filters arranged in cascade.

FIG. 6 shows a multi-passband SAW filter illustrative of yet another embodiment of the present invention.

DETAILED DESCRIPTION OF THE PREFERRED EMBODIMENT

Figure 1:
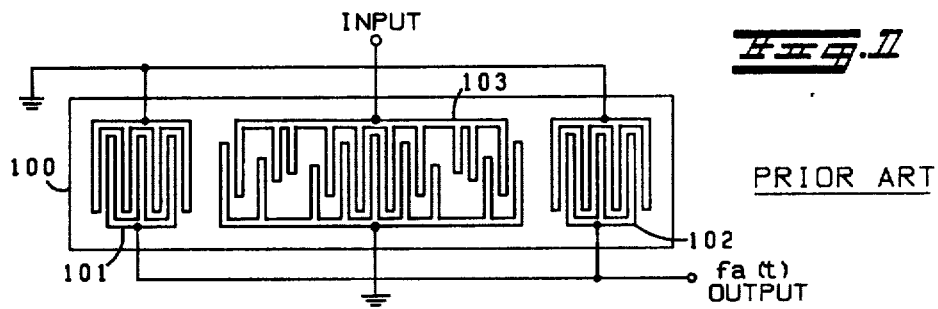
FIG. 1 shows a prior art three-transducer SAW filter.

In FIG. 1, there is illustrated a prior art three-transducer SAW filter including a piezoelectric substrate 100, an input transducer 103 and output transducers 101 and 102. The input transducer 103 is shown with apodized weighting although any suitable weighting known in the art may be utilized. According to apodized weighting, the overlap of adjacent interdigital fingers of a transducer are sine-wave contoured for improving the passband characteristics of the filter. Apodized weighting is described in more detail in the aforementioned 1972 National Electronics Conference report.

A SAW filter may be designed where the input transducer 103 has a frequency response $H_2(w)$, and the output transducers 101 and 102 have a frequency response $H_1(w)$, where w, the radian frequency, is two pi times the frequency. In general, the functions $H_1(w)$ and $H_2(w)$ are different, their exact nature depending on the particular application and desired frequency response. The overall response, $F(w)$, for the SAW filter of FIG. 1 may be expressed by the following equation:

$$F(w) = H_1(w)H_2(w)e^{-jw\tau}; \quad (1)$$

where $\tau$ is the time of the propagation of the surface waves from the input transducer 103 to the output transducers 101 and 102. There are several methods known in the art for designing transducers with specific responses $H_1(w)$ and $H_2(w)$ desired for a particular application. In accordance with the present invention, it has been found that where at least one of the transducers has an axis of symmetry from which surface waves propagate symmetrically, then the other transducer need not have such an axis of symmetry. Such an axis of symmetry is essentially the geometric center of the transducer. In other words, a transducer is essentially split into two identical halves by its axis of symmetry.

Figure 2:
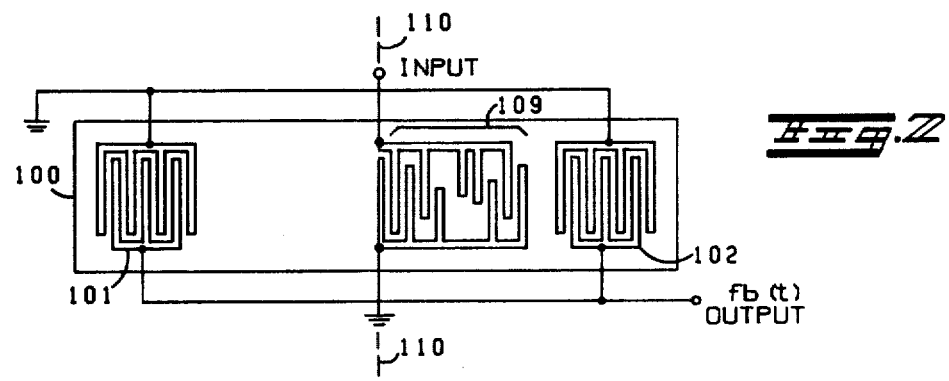
FIG. 2 shows a three-transducer SAW filter illustrative of one embodiment of the present invention.

Now turning to FIG. 2, there is shown an embodiment of the present invention where the input transducer 109 is designed to be symmetric about the axis 110, while the output transducers 101 and 102 need not have an axis of symmetry. The axis of symmetry 110 of input transducer 109 is substantially equidistant from output transducers 101 and 102. Input transducer 109 is one-half of a transducer divided into identical halves by axis of symmetry 110. Alternatively, the filter of FIG. 2 may be provided with the opposite half of input transducer 109, leaving the area presently occupied by input transducer 109 vacant. If corresponding transducers of FIG. 1 and FIG. 2 are designed to have similar frequency responses, the filters in FIG. 1 and FIG. 2 will have essentially identical electrical characteristics.

Since only one-half of the interdigital fingers are necessary for input transducer 109 of FIG. 2, fabrication of the SAW filter is not only simplified, but also results in cost savings over prior art SAW filters. Furthermore, a reduction in overall distortion caused by each finger due to its mass loading and electrical discontinuities is realized since fewer interdigital fingers are required.

Figure 3:
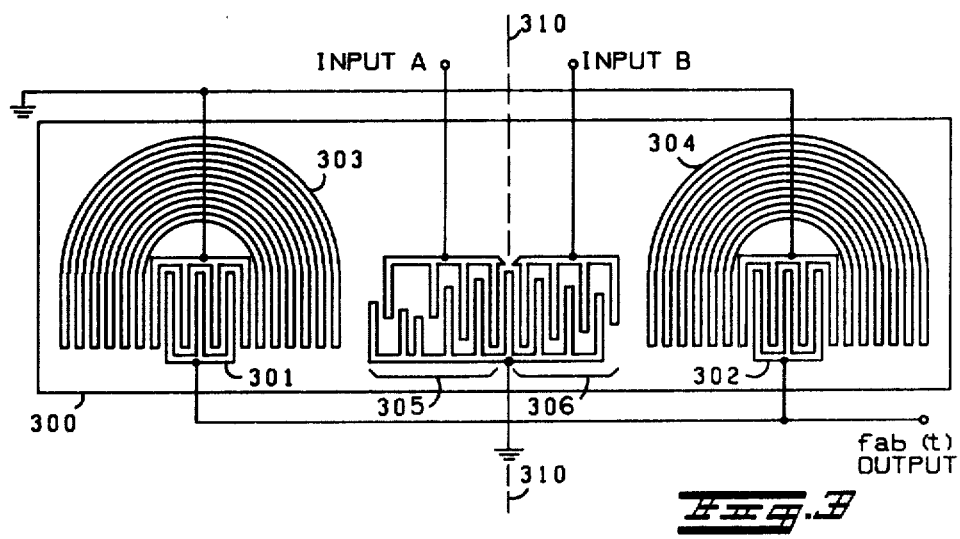
FIG. 3 shows a dual-passband SAW filter illustrative of another embodiment of the present invention.

Since the SAW filter of FIG. 2 is inherently a linear device, a second transducer, which likewise has an axis of symmetry, may be provided in accordance with another feature of the present invention by placing one-half of the interdigital fingers of the second input transducer into the vacant area opposite the interdigital fingers of input transducer 109, resulting in a dual-passband SAW filter such as that illustrated in FIG. 3. In FIG. 3, input transducers 305 and 306, which may have different frequency responses, are symmetric about their respective axes, which are arranged collinearally with respect to one another and are represented by dashed line 310. The collinear axes of symmetry 310 of input transducers 305 and 306 are located substantially equidistant from output transducers 301 and 302. However, since input transducers 305 and 306 are not identical, it may be necessary to locate one of the output transducers slightly closer to or further from the collinear axes of symmetry 310 to insure that the propagation time of surface waves from input transducers 305 and 306 to output transducers 301 and 302 is substantially the same. In addition, output transducers 301 and 302 may also be surrounded by semicircular coupling strips 303 and 304, respectively, for rendering the respective output transducers unidirectional and for minimizing the insertion loss of the SAW filter. The design of semicircular coupling strips 303 and 304 is further described in the aforementioned 1972 National Electronics Conference report.

Figure 4:
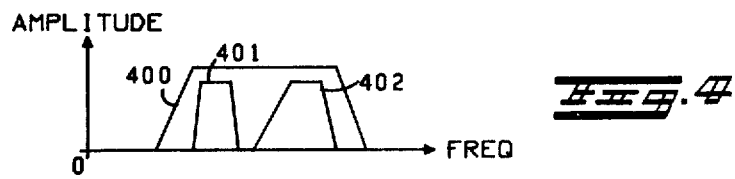
FIG. 4 shows an amplitude versus frequency response of a dual-passband SAW filter such as that shown in FIG. 3.

Referring to FIG. 3, input signals A and B are first filtered by input transducers 305 and 306, which may provide passbands such as waveforms 401 and 402 of FIG. 4, respectively. The signals filtered from inputs A and B are then filtered by the output transducers 301 and 302, which may exhibit a passband such as waveform 400 of FIG. 4, to provide a composite output signal. An additional advantage of the configuration of FIG. 3 is that the input signals A and B are conveniently filtered and summed without utilizing a summing circuit or without experiencing losses from connecting two separate filters together (e.g., such as losses produced when each filter loads the other).

Furthermore, the SAW filter of FIG. 3 is entirely reciprocal and may be operated inversely by reversing the input and output connections such that an input signal is coupled to output transducers 301 and 302. An input signal applied to output transducers 301 and 302 is essentially sorted in frequency by the input transducers 305 and 306, which have passbands such as waveforms 401 and 402 of FIG. 4, to provide corresponding output signals therefrom without utilizing additional power dividing or multiplexing circuitry. Thus, an input signal would be sorted into its frequency compenents lying in the passbands 401 and 402 of the input transducers 305 and 306. Multiplexing problems, such as those encountered in continguous filter bank applications, may be readily solved by utilizing a SAW filter embodying the present invention. Furthermore, the SAW filter of FIG. 3, when arranged inversely, may be advantageously utilized in any suitable application where a contiguous filter bank is required.

Referring to FIG. 1, it may be mathematically demonstrated by the following equations that substantially identical filter performance may be obtained by removing one-half of the interdigital fingers of input transducer 103. Since the input transducer 103 is bi-directional in nature, surface acoustic waves propagate both to the right and the left to be convolved with the output transducers 101 and 102. The output transducers 101 and 102 are coupled in parallel for summing the surface acoustic waves received by each of them. By expressing equation (1) as a function of time, t, and choosing t = zero at the axis of symmetry of the input transducer 103, the filter output signal, $f_a(t)$, may be represented as:

$$f_a(t) = \tfrac{1}{2}\int_{-\tau}^{\tau} h_2(\lambda)h_1(t-\lambda)d\lambda + \tfrac{1}{2}\int_{-\tau}^{\tau} h_2(-\lambda)h_1(t-\lambda)d\lambda; \quad (2)$$

where $h_2(t)$ is the frequency response for input transducer 103, $h_1(t)$ is the frequency response for output transducers 101 and 102 and $\lambda$ is the variable of integration. If input transducer 103 has an axis of symmetry, then surface acoustic waves travelling in opposite directions will propagate substantially identically, and its frequency response, $h_2(t)$, will also be symmetric in time about the axis of symmetry. Since $h_2(t)$ is a symmetric function, the following identity is true:

$$h_2(t) = h_2(-t); \text{ for } -\tau \leq t \leq \tau. \quad (3)$$

Next, by substituting equation (3) into equation (2), the following equation results:

$$f_a(t) = \int_{-\tau}^{\tau} h_2(\lambda)h_1(t-\lambda)d\lambda \quad (4)$$

Since the function $h_2(t)$ is the sum of the surface acoustic wave signals propagated by the right and left halves of the input transducer 103, the function $h_2(t)$ may also be written as:

$$h_2(t) = h_R(t) + h_L(t) \quad (5)$$

where $h_R(t) = h_2(t)$; for $0 \leq t \leq \tau$;
and $h_L(t) = h_2(t)$; for $-\tau \leq t \leq 0$.

A similar set of equations may be likewise provided for the SAW filter of FIG. 2. Thus, the filter output signal, $f_b(t)$, may be expressed as:

$$f_b(t) = \int_0^{\tau} h_R(\lambda)h_1(t-\lambda)d\lambda + \int_{-\tau}^{0} h_R(-\lambda)h_1(t-\lambda)d\lambda \quad (6)$$

The integrals of equation (6) may be combined to provide the following equation:

$$f_b(t) = \int_{-\tau}^{\tau} [h_R(\lambda) + h_R(-\lambda)] h_1(t-\lambda)d\lambda \quad (7)$$

Since the function $h_2(t)$ is a symmetric function, the following identity is true:

$$h_R(-t)\big|_{-\tau}^{0} = h_L(t)\big|_{-\tau}^{0} \quad (8)$$

Next, substituting equation (8) into equation (5), the function $h_2(t)$ may be expressed as:

$$h_2(t) = h_R(t) + h_R(-t) \quad (9)$$

Finally, by substituting equation (9) into equation (7), equation (7) may be re-written as:

$$f_b(t) = \int_{-\tau}^{\tau} h_2(\lambda)h_1(t-\lambda)d\lambda \quad (10)$$

Thus, the resulting equation (10) for the SAW filter of FIG. 2 is identical to equation (3) for the SAW filter of FIG. 1, which results in:

$$f_a(t) = f_b(t) \quad (11)$$

The foregoing equations clearly demonstrate that if the input transducer 103 of the SAW filter of FIG. 1 has an axis of symmetry, one-half of the interdigital fingers of the input transducer 103 may be eliminated to provide the SAW filter of FIG. 2. Furthermore, from the foregoing set of equations, it is apparent that one-half of the interdigital fingers of a second symmetric input transducer may be disposed in the vacant space opposite input transducer 109 of FIG. 2. Thus, for the SAW filter of FIG. 3, the filter output signal $f_{ab}(t)$ may be expressed by the following equation:

$$f_{ab}(t) = \int_{-\tau}^{\tau} h_2(\lambda)h_1(t-\lambda)d\lambda + \int_{-\tau}^{\tau} g_2(\lambda)h_1(t-\lambda)d\lambda \quad (12)$$

where the function $h_2(t)$ corresponds to input transducer 305, the function $g_2(t)$ corresponds to input transducer 306 and the function $h_1(t)$ corresponds to output transducers 301 and 302.

A typical amplitude vs. frequency response of the SAW filter of FIG. 3 is illustrated in FIG. 4, where $h_2(t)$ may be response 401, $g_2(t)$ may be response 402 and $h_1(t)$ may be response 400. The surprising result is that the SAW filter of FIG. 3 provides two distinct filters in the same space required by one prior art SAW filter. Moreover, the dual-passband SAW filter of FIG. 3 not only provides a single summed output signal without degrading the electrical characteristics of the SAW filter, but also provides significant improvements in size reduction, cost reduction and ease of fabrication over the prior art. For example, in order to provide a composite output signal as in FIG. 3, it would necessitate two prior art SAW filters, external matching circuits and external summing circuits for combining the SAW filter output signals.

The dual-passband SAW filter of FIG. 3 may be advantageously utilized in any application where two input signals are desired to be filtered and combined to provide a single composite output signal. For example, the dual-passband SAW filter of the present invention may be utilized as a preselector in a radio-frequency (RF) radio receiver, where an RF signal and a local oscillator injection signal are summed to provide a composite signal to a following mixer stage thereof.

The dual-passband SAW filter of FIG. 3 may also be cascaded with another SAW filter, such as those of FIG. 1, FIG. 2 and FIG. 3. For example, two non-identical SAW filters 500 and 501 are arranged in cascade in FIG. 5. Input signals A and B are coupled to input transducers 503 and 504, respectively, of SAW filter 500. Input signals A and B are filtered and combined by SAW filter 500 to provide a composite output signal at output transducers 502 and 505. The composite output signal from output transducers 502 and 505 of SAW filter 500 are applied to transducers 506 and 509 of SAW filter 501. Here the input and output connections of SAW filter 501 are the reverse of those for SAW filter 500 in order to frequency sort the composite output signal from SAW filter 500. Finally, frequency-sorted output signals A and B are provided at transducers 507 and 508 of SAW filter 501. The filter arrangement of FIG. 5 would be useful in an application where it is desired to sort frequency components in two narrow passbands from wideband input signals which have different bandwidths.

Moreover, a multi-passband SAW filter may be provided by utilizing the inventive features of the present invention. In FIG. 6, input signals A, B, C and D are coupled to transducers 602, 603, 605 and 606, respectively, and are filtered and combined into a single output signal from transducers 601, 604 and 607. Furthermore, the input and output connections of multi-passband SAW filter of FIG. 6 may be interchanged, such that an input signal coupled to transducers 601, 604 and 607 is sorted in frequency by the passbands of transducers 602, 603, 605 and 606 to provide corresponding output signals therefrom.

In summary, an improved three-transducer SAW filter has been described which requires only one-half of the interdigital fingers normally provided for the central input transducer of prior art SAW filters. Since only one-half of the central input transducer is necessary, one-half of another input transducer having a different frequency response may be placed in the vacant area to provide a dual-passband filter. Thus, when two input signals are coupled to the input transducers of a dual-passband SAW filter, the output transducers provide a composite output signal comprised of the filtered and combined input signals. Furthermore, if an input signal is coupled to the output transducers of a dual-passband SAW filter, the input signal is sorted in frequency by each of the input transducers to provide corresponding output signals.

I claim:

1. A surface acoustic wave (SAW) filter, comprising:
a piezoelectric substrate having at least one surface;
first and second transducer means disposed on the surface of the substrate at a predetermined distance from one another, the first and second transducer means each having a plurality of interdigital fingers; and
third and fourth non-identical transducer means disposed on the surface of the substrate between the first and second transducer means, the substrate having an axis located substantially equidistant between the first and second transducer means, and the third transducer means including a plurality of interdigital fingers disposed substantially to one side of the substrate axis, and the fourth transducer means including a plurality of interdigital fingers disposed substantially to the side opposite said one side of the substrate axis.

2. The SAW filter according to claim 1, wherein the interdigital fingers of said first and second transducer means are substantially identically arranged, and said first and second transducer means are electrically coupled in parallel.

3. The SAW filter according to claim 2, further adapted to receive first and second input signals, the first input signal coupled to one of, and the second input signal coupled to the other of, the third and fourth transducer means, and the first and second transducer means providing a composite output signal comprised of the filtered first and second input signals.

4. The SAW filter according to claim 3, further adapted to receive a radio-frequency (RF) signal and a receiver injection signal from an RF receiver having mixing circuitry, the first and second input signals being the RF signal and receiver injection signal and the composite output signal being coupled to the receiver mixing circuitry.

5. The SAW filter according to claim 2, further including a plurality of semicircular coupling strips disposed around each of the first and second transducer means for substantially unidirectionally coupling surface acoustic waves to the first and second transducer means.

6. The SAW filter according to claim 2, further including fifth transducer means disposed at a predetermined distance from one of the first and second transducer means, and further including sixth and seventh transducer means, said substrate having a second axis located substantially equidistant between said one of the first and second transducer means and the fifth transducer means, the sixth and seventh transducer means each having a plurality of interdigital fingers arranged such that the interdigital fingers of the sixth transducer means are disposed substantially to one side of the second axis and the interdigital fingers of the seventh transducer means are disposed substantially to the side opposite said one side of the second axis.

7. The SAW filter according to claim 6, wherein the interdigital fingers of said first, second and fifth transducer means are substantially identically arranged and electrically coupled in parallel.

8. The SAW filter according to claim 2, further adapted to receive an input signal, the input signal coupled to the first and second transducer means, and the third and fourth transducer means frequency sorting the input signal to provide first and second output signals, respectively.

9. A surface acoustic wave (SAW) filter, comprising:
a piezoelectric substrate having at least one surface;
first and second transducer means disposed on the surface of the substrate at a predetermined distance from one another, the first and second transducer means being electrically coupled in parallel and each having a plurality of parallel interdigital fingers; and
third and fourth transducer means disposed on the surface of the substrate between the first and second transducer means, the substrate having an axis located substantially equidistant between said first and second transducer means, and the third and fourth transducer means each having a plurality of parallel interdigital fingers arranged such that the interdigital fingers of the third transducer means are disposed substantially to one side of the substrate axis and the interdigital fingers of the fourth transducer means are disposed substantially to the side opposite said one side of the substrate axis.

10. The SAW filter according to claim 9, further adapted to receive first and second input signals, the first input signal coupled to one of, and the second input signal coupled to the other of, the third and fourth transducer means, and the first and second transducer means providing a composite output signal comprised of the filtered first and second input signals.

11. The SAW filter according to claim 10, further including a second SAW filter substantially the same as the first SAW filter, and arranged together with the first SAW filter, such that the composite output signal from the first and second transducer means of the first SAW filter is coupled to the third and fourth transducer means of the second SAW filter.

12. The SAW filter according to claim 10, further including a second SAW filter substantially the same as the first SAW filter, and arranged together with the first SAW filter, such that the composite output signal from the first and second transducer means of the first SAW filter is coupled to the first and second transducer means of the second SAW filter.

13. The SAW filter according to claim 10, further adapted to receive a radio-frequency (RF) signal and a receiver injection signal from an RF receiver having mixing circuitry, the first and second input signals being the RF signal and receiver injection signal and the composite output signal being coupled to the receiver mixing circuitry.

14. The SAW filter according to claim 9, further including a plurality of semicircular coupling strips disposed around each of the first and second transducer means for substantially unidirectionally coupling surface acoustic waves to the first and second transducer means.

15. The SAW filter according to claim 9, further including fifth transducer means disposed at a predetermined distance from, and electrically coupled in parallel with, one of the first and second transducer means, and further including sixth and seventh transducer means, said substrate having a second axis located substantially equidistant between said one of the first and second transducer means and the fifth transducer means, the sixth and seventh transducer means each having a plurality of parallel interdigital fingers arranged such that the interdigital fingers of the sixth transducer means are disposed substantially to one side of the second axis and the interdigital digital fingers of the seventh transducer means are disposed substantially to the side opposite said one side of the second axis.

16. The SAW filter according to claim 9, further adapted to receive an input signal, the input signal coupled to the first and second transducer means, and the third and fourth transducer means frequency sorting the input signal to provide first and second output signals, respectively.

17. A multi-passband surface acoustic wave (SAW) filter adapted to filter and combine first and second input signals, comprising:

a piezoelectric substrate having at least one surface,
first and second input transducers each having a plurality of parallel interdigital fingers disposed at a predetermined spacing therebetween, said substrate further having an axis located between the first and second input transducers, the first and second input transducers arranged on the surface of the substrate such that the interdigital fingers of the first input transducer are disposed substantially to one side of the substrate axis and the interdigital fingers of the second input transducer are disposed substantially to the side opposite said one side of the substrate axis, and the first and second transducers further being adapted to receive the first and second input signals, respectively; and first and second output transducers disposed on the surface of the substrate on opposite sides of, and substantially equidistant from, the substrate axis, the first and second output transducers each having a plurality of parallel interdigital fingers disposed at a predetermined spacing therebetween and arranged parallel to the interdigital fingers of the first and second input transducers, and the first and second output transducers further being electrically coupled in parallel for combining the filtered first and second input signals received from the first and second input transducers to provide a composite output signal.

18. The multi-passband SAW filter of claim 17 further adapted to filter and combine first, second, third and fourth input signals, wherein said multi-passband SAW filter further includes a third output transducer disposed at a predetermined distance from, and electrically coupled in parallel with, one of the first and second output transducers; and said filter further includes third and fourth input transducers adapted to receive the third and fourth input signals, respectively, the third and fourth input transducers disposed on the surface of the substrate between said one of the first and second output transducers and the third output transducer, the third and fourth input transducers having collinear axes of symmetry located substantially equidistant between said one of the first and second output transducers and the third output transducer, and the third and fourth input transducers each having a plurality of parallel interdigital fingers disposed at a predetermined spacing therebetween and arranged such that the interdigital fingers of the third input transducer are disposed substantially to one side of the collinear axes of symmetry of the third and fourth input transducers and the interdigital fingers of the fourth input transducer are disposed substantially to the side opposite said one side of the collinear axes of symmetry of the third and fourth input transducers, and the composite signal provided by the first, second and third output transducers being comprised of the filtered first, second, third and fourth input signals.

* * * * *